(12) United States Patent
Maruyama et al.

(10) Patent No.: US 7,087,297 B2
(45) Date of Patent: Aug. 8, 2006

(54) PROTECTIVE FILM TRANSFER SHEET FOR PHOTO MASKS AND A METHOD FOR TRANSFERRING A PROTECTIVE FILM USING THE SAME

(75) Inventors: Mitsunori Maruyama, Saitama (JP); Susumu Kurishima, Saitama (JP)

(73) Assignee: Kimoto Co., Ltd., Tokyo (JP)

( * ) Notice: Subject to any disclaimer, the term of this patent is extended or adjusted under 35 U.S.C. 154(b) by 0 days.

(21) Appl. No.: 09/863,324

(22) Filed: May 24, 2001

(65) Prior Publication Data

US 2002/0000287 A1     Jan. 3, 2002

(30) Foreign Application Priority Data

May 25, 2000    (JP)    ............................. 2000-154453

(51) Int. Cl.
  *B32B 7/12*    (2006.01)
  *B32B 15/04*   (2006.01)

(52) U.S. Cl. ...................... 428/343; 428/354; 428/352; 428/355 AC

(58) Field of Classification Search ................ 428/343, 428/354, 355 R, 355 AC, 355 CN, 352
See application file for complete search history.

(56) References Cited

U.S. PATENT DOCUMENTS 5,051,295 A * 9/1991 Mori et al. ................. 428/195

FOREIGN PATENT DOCUMENTS

JP     63-132097    6/1988
JP     6-20601      6/1994

OTHER PUBLICATIONS

Definition of "Prepolymer", Concise Encyclopedia of Polymer Science and Engineering; J. Kroschwitz; John Wiley & Sons; 1990; p. 902.*

Transaltion of JP 63-132097 by FLS, Inc., see IDS dated Feb. 3, 2004 for date and additional information.*

* cited by examiner

*Primary Examiner*—Victor S. Chang
(74) *Attorney, Agent, or Firm*—Bacon & Thomas, PLLC

(57) ABSTRACT

A protective film transfer sheet comprises a peelable support and a protective film formed on the support, wherein the protective film comprises a protective layer and an adhesive layer formed on the support in this order and the adhesive layer has pressure-sensitive adhesiveness, the adhesiveness of the adhesive layer being increased upon heating after transferred on the image surface of photo masks, and is curable by exposure to ionizing radiation. The protective film formed by the protective film transfer sheet is excellent in adhesiveness to the image surface of photo masks, mar resistance and resistance to solvents.

9 Claims, 1 Drawing Sheet

PROTECTIVE FILM TRANSFER SHEET FOR PHOTO MASKS AND A METHOD FOR TRANSFERRING A PROTECTIVE FILM USING THE SAME

BACKGROUND OF THE INVENTION

The present invention relates to a protective film transfer sheet for photo masks. In particular, it relates to a transfer sheet for transferring a protective film suitable for protecting copies for photomechanical process or copies of printed wiring boards, which are susceptible to damage, and a method for transferring a protective film using the transfer sheet.

A surface protective film comprising a thin plastic film such as a polyethylene terephthlate film, as a support, and a releasing film laminated on the plastic film via a self-adhesive or bonding agent has been used for protecting copies of photomechanical process or printed wiring boards, which are susceptible to damage. When the surface protective film is used for photo masks, the releasing film is peeled off from the support and the surface applied with the self-adhesive or bonding agent is laminated on the image surface of photo masks.

In recent years, patterns formed on photo masks, which are copies used for photomechanical process or copies of printed wiring boards, become complicated and are required to have a high resolving power. This raises demand for thinner protective films. However, if the thickness of the plastic film of surface protective films having the aforementioned structure becomes thin, its workability of laminating on photo masks becomes bad, and wrinkles and cells are likely to be produced.

In order to improve such protective films, Japanese Utility Model Publication No.6-20601, for example, discloses a multiple layer sheet for making a protective film which comprises a plastic film having an uneven surface, an abrasion resistance film formed on the uneven surface, an easy-releasing sheet having a self-adhesive layer and a releasing layer formed on the abrasion resistance film. Another transfer sheet comprising a releasing sheet, a resin layer cured by exposure to UV or electron beam and an adhesive layer consisting an ionizing radiation curable resin formed on the releasing surface of the releasing sheet in this order is also known (Japanese Patent Un-examined Publication No. 63-132097).

However, when the generally used self-adhesive is employed as in the disclosure of Japanese Utility Model Publication No.6-20601, the transferred protective layer is insufficient in resistance to marring even if itself has a sufficient hardness because of softness of the self-adhesive layer. In addition, if it is used for protection of photo masks of printed wiring boards, there arises a following problem. That is, photo-resist may stick to the surface of the protective layer and be removed using organic solvents. However, the protective film has low resistance to solvents and, therefore, has low durability.

The adhesive layer consisting of an ionizing radiation curable resin as disclosed in Japanese Patent Un-examined Publication No. 63-132097 is likely to lose adhesiveness when the thickness becomes thin. If the protective film with extremely lowered adhesiveness is used for protection of a photo mask of a printed wiring board, the adhesive layer comes away from the image surface of the photo mask when the photo mask is peeled from the photo-resist on the board. Thus, the protective layer has low durability. Further, if the adhesive layer consists of an ionizing radiation curable resin alone, flowability of the adhesive layer becomes too high, and workability becomes bad because the adhesive layer is likely to be pressed out upon adhering.

The present invention aims at solving the above-mentioned problems. An object of the present invention is to provide a protective film transfer sheet for photo masks capable of providing a protective film, which is excellent in adhesiveness to the image surface of photo masks, mar resistance and resistance to solvents when transferred to photo masks. Another object of the present invention is to provide a method for transferring a protective film using the transfer sheet, which is capable of providing a protective film excellent in adhesiveness to the image surface of photo masks, mar resistance and resistance to solvents when transferred to photo masks.

SUMMARY OF THE INVENTION

A protective film transfer sheet of the present invention comprises a peelable support and a protective film formed on the support, wherein the protective film comprises a protective layer and an adhesive layer formed on the support in this order and the adhesive layer has pressure-sensitive adhesiveness, the adhesiveness of the adhesive layer being increased by heat imparted after it is transferred on the image surface of a photo mask, and is curable by exposure to ionizing radiation.

In the protective film transfer sheet of the present invention, the adhesive layer contains at least an ionizing radiation curable resin and a heat-reactive resin.

In the protective film transfer sheet of the present invention, the heat-reactive resin is an acrylic copolymer containing a monomer having a heat-reactive functional group(s) as a monomer.

In the protective film transfer sheet of the present invention, the monomer having a heat-reactive functional group(s) is a monomer having a hydroxyl group.

In the protective film transfer sheet of the present invention, the monomer having a hydroxyl group is N-methylol acrylamide monomer.

In the protective film transfer sheet for photo masks of the present invention, the ionizing radiation curable resin consists of a paint containing one or more kinds of photopolymerizable prepolymers or photopolymerizable monomers which can be cross-linked and cured by exposure to ionizing radiation, and at least one kind of the photopolymerizable prepolymers and photopolymerizable monomers has a hydroxyl group.

A method for transferring a protective film of the present invention, which uses the above-mentioned protective film transfer sheet for photo masks for transferring a protective film on the image surface of photo masks, comprises the steps of:

(1) adhering the adhesive layer of the protective film transfer sheet for photo masks on the image surface of a photo mask,
(2) imparting heat to the adhesive layer,
(3) exposing the adhesive layer to ionizing radiation, and
(4) peeling off the support from the protective film.

In the method for transferring a protective film of the present invention, the steps (1) and (2) are preferably performed simultaneously and thereafter the steps (3) and (4) are performed in this order.

According to the present invention, there is provided a protective film transfer sheet capable of providing a protective film which is excellent in adhesiveness to the image surface of photo masks, mar resistance and resistance to solvents when transferred on photo masks.

PREFERRED EMBODIMENTS OF THE INVENTION

Figure 1:
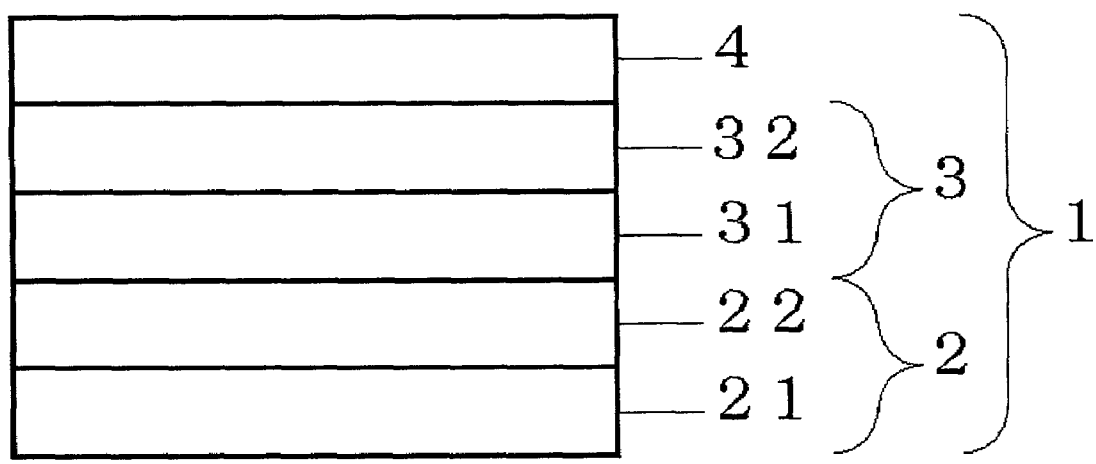
FIG. 1 is a sectional view of an example of a protective film transfer sheet for photo masks of the present invention.

The protective film transfer sheet for photo masks of the present invention is described in further detail with reference to the attached drawing.

As shown in FIG. 1, the protective film transfer sheet 1 of the present invention includes protective film 3 consisting of a protective layer 31 and an adhesive layer 32 on a peelable support and, as occasion demands, a separator 4 is laminated to adhesive layer 32.

The support 2 of the present invention is a base material on which the protective layer 31 and adhesive layer 32 are laminated successively and facilitates a process of transferring a thin protective film 3 on the image surface of photo masks.

Although the support 2 is not particularly limited, it is preferably transparent to ionizing radiation so that the adhesive layer 32 is exposed to ionizing radiation through the support 2 and cured. A transparent plastic film such as a polyethylene terephthalate film, polycarbonate film, polypropylene film, polyethylene film, polyvinyl chloride film, polyethylene naphthalate film, polystyrene film may be used for the support 2. A biaxially stretched film is preferable for its excellent mechanical strength, heat resistance and dimensional stability. The thickness of the support 2 is preferably 5–125 μm in the light of handling.

In order to improve release properties of the support 2 from the protective layer 31, a plastic film 21 having a release layer 22 may be used for the support 2.

The release layer 22 remains on the surface of the plastic film 21 after transferring the protective film 3 and makes the support 2 removed easily. Material of the release layer may be selected from melamine resins, silicone resins, amino alkyd resins, urethane resins, urea resins, epoxy resins, fluorine resins, polyvinyl alcohol resins, polyvinyl methylether/maleic acid anhydrate copolymers and so forth taking account of combination with the protective layer 31. Among them, water-soluble resins such as polyvinyl alcohol resins, polyvinyl methylether/maleic acid anhydrate copolymers and the like is preferable in the light of releasing power and easiness of laminating.

When the transferred surface is required to be uneven, the release layer 22 may include matting agents. In order to improve adhesiveness to the plastic film 21, an easy adhesive layer may be provided between the release layer 22 and the plastic film 21.

The protective layer 31 is required to have high mar resistance and resistance to solvents, because the protective layer 31 becomes an uppermost layer of the protective film after it is transferred to the image surface of a photo mask and its properties directly affect those of the protective film 3.

The protective layer 31 having such high mar resistance and resistance to solvents can be obtained by applying a composition consisting of a thermosetting resin or an ionizing radiation curable resin on the support 2 using a known coating technique and curing it.

Usable thermosetting resins include resins crosslinkable by heat such as silicone resins, melamine resins, epoxy resins, amino alkyd resins, urethane resins, acrylic resins, polyester resins, phenol resins. These resins may be used alone but preferably added with a hardening agent in order to improve crosslinking ability and hardness of the crosslinked film.

The ionizing radiation curable resin is composed of a paint crosslinkable and curable at least by exposure to ionizing radiation (ultraviolet ray or electron beam). As the ionizing radiation curable paint, a mixture of one or more kinds of photopolymerizable prepolymers or photopolymerizable monomers may be used.

Usable photopolymerizable prepolymers include various kinds of (meth)acrylates such as polyester(meth)acrylate, epoxy(meth)acrylate, urethane(meth)acrylate, polyether (meth)acrylate, polyol(meth)acrylate, melamine(meth)acrylate.

Examples of the photopolymerizable monomer include styrene monomers such as styrene, α-methyl styrene, (meth)acrylate esters such as methyl(meth)acrylate, 2-ethylhexyl (meth)acrylate, methoxyethyl(meth)acrylate, butoxyethyl (meth)acrylate, butyl(meth)acrylate, methoxybutyl(meth) acrylate, phenyl(meth)acrylate, ethyl(meth)acrylate, propyl (meth)acrylate, ethoxymethyl(meth)acrylate, lauryl(meth) acrylate, unsaturated carboxylic acid amide such as (meth) acryl amide, substituted amino alcohol esters of unsaturated acid such as 2-(N,N-diethylamino)ethyl(meth)acrylate, 2-(N,N-dibenzylamino)ethyl (meth)acrylate, 2-(N,N-diethylamino)propyl (meth)acrylate, multifunctional compounds such as ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di (meth) acrylate, tetrapropylene glycol di(meth)acrylate, nonapropylene glycol di (meth)acrylate, polypropylene glycol di(meth)acrylate, pentaerythritol tri (meth)acrylate, dipentaerythritol tri(meth)acrylate, pentaerythritol hexa(meth)acrylate, trimethylolpropane(meth) acrylate, glycerol tri(meth)acrylate, tris-(2-hydroxyethyl)-isocyanuric acid ester (meth)acrylate, 2,2-bis[4-(acryloxy diethoxy)phenyl]propane, 3-phenoxy-2-propanoyl acrylate, 1,6-bis (3-acryloxy-2-hydroxypropyl)-hexyl ether, and polythiol compounds having two or more of thiol groups per molecule such as trimethylol propane trithioglycolate, trimethylol propane trithiopropylate, pentaerythritol tetrathioglycolate.

Various kinds of additives can be added to the ionizing radiation curable paint. When UV is used for curing, it is preferable to add a photopolymerization initiator, UV intensifier or the like. Usable photopolymerization initiators include acetophenones, benzophenones, Michler's ketone, benzoin, benzylmethylketal, benzoyl benzoate, α-acyloxymester, thioxanthens and the like. As the UV intensifier, n-butylamine, triethylamine, tri-n-butylphosphine and the like can be exemplified.

Examples of the known coating method for applying the aforementioned thermosetting resin or ionizing radiation curable resin to the support include knife coating, doctor coating, bar coating, roll coating, blade coating, kiss-roll coating, spray coating, spin coating, dip coating and the like.

The adhesive layer 32 of the present invention is adhered to the image surface of photo masks by its pressure-sensitive adhesiveness at a normal temperature. The adhesiveness to the image surface of photo masks increases by heat imparted after the layer 32 is adhered. In addition, when the adhesive layer 32 is cured by exposure to ionizing radiation, the adhesiveness and the hardness of the layer 32 also increase.

Such an adhesive layer 32 contains an ionizing radiation curable resin and a heat-reactive resin.

The aforementioned paint for the protective layer 31, which is crosslinkable and curable by exposure to ionizing radiation (ultraviolet ray or electron beam), can be used for the ionizing radiation curable resin for the adhesive layer 32. Photopolymerizable prepolymers or photopolymerizable monomers used for the ionizing radiation curable paint are preferably those having a hydroxy group(s).

When the adhesive layer 32 is formed using a mixture of an ionizing radiation curable resin consisting of ionizing radiation curable paint containing the photopolymerizable prepolymers or photopolymerizable monomers having a hydroxy group(s) and a heat-reactive resin consisting of an acrylic copolymer containing a monomer having a hydroxy group such as an N-methylol acrylamide monomer as a monomer having a heat-reactive functional group(s), which will be explained later, the hardness of the adhesive layer 32 can be improved by reaction of ionizing radiation curable resins with the heat-reactive resins and the adhesiveness to the image surface of the photo masks can be also increased.

Examples of the the photopolymerizable prepolymers or photopolymerizable monomers having a hydroxy group(s) include pentaerythritol tri(meth)acrylate, 1,6-bis(3-acryloxy-2-hydroxypropyl)-hexylether.

Similarly to the aforementioned paint for the protective layer 31, the ionizing radiation curable paint may contain photopolymerization initiators, UV intensifier and the like.

Reaction of the heat-reactive resin proceeds by heat, which is added after the adhesive layer 32 is adhered to the photo mask, at the interfaces between the adhesive layer 32 and protective layer 31, and between the adhesive layer 32 and the image surface of photo mask so that the adhesiveness at the interfaces is increased. Generally, the heat reaction of heat-reactive resins also increases the hardness of the adhesive layer 32.

The heat-reactive resin consists of an acrylic copolymer containing a monomer having a heat-reactive functional group as a monomer component. Such an acrylic copolymer can be a copolymer of (meth) acrylate monomer and a monomer having a heat-reactive functional group.

Examples of the (meth)acrylate monomer include ethyl (meth)acrylate, butyl(meth)acrylate, amyl(meth)acrylate, 2-ethylhexyl(meth)acrylate, octyl(meth)acrylate, cyclohexyl (meth)acrylate, benzyl(meth)acrylate and the like. One or more kinds of these monomers can be used in a mixture.

Examples of the monomer having a heat-reactive functional group include a monomer having a carboxy group such as (meth) acrylic acid, crotonic acid, maleic acid, fumaric acid, itaconic acid, a monomer having a hydroxy group such as 2-hydroxyethyl(meth)acrylate, 2-hydroxypropyl(meth)acrylate, 4-hydroxybutyl(meth)acrylate, N-methylol acrylamide, aryl alcohol, a monomer having a tertial amino group such as dimetyl aminoethyl(meth)acrylate, dietyl aminoethyl(meth)acrylate, dimetyl aminopropyl (meth)acrylate, a monomer having an amide group such as (meth)acrylamide, a monomer having a N-substituted amide group such as N-methyl(meth)acrylamide, N-ethyl(meth) acrylamide, N-methoxymethyl(meth)acrylamide, N-ethoxymethyl (meth) acrylamide, N-t-butyl acrylamide, N-octyl acrylamide, a monomer having an epoxy group such as glycidyl (meth) acrylate. Among them, a monomer having a hydroxy group such as an N-methylol acrylamide monomer is particularly preferable to obtain excellent adhesiveness to the object on which the adhesive layer 32 of the present invention is transferred, i.e., the image surface of a photo mask. It is considered that, when the monomer having a hydroxy group is used for the adhesive layer 32, the monomer reacts with hydroxy group existing in the image surface of photo masks to increase the adhesiveness. This strong adhesion of the protective film 3 and the image surface of a photo mask prevents the protective film 3 from coming away from the image surface during working and, thereby, workability is improved.

Polymerization ratio of the monomers of the acrylic copolymer, i.e., a (meth)acrylate monomer and a monomer having a heat-reactive functional group, is 1–25 weight parts, preferably 5–15 weight parts of a monomer having a heat-reactive functional group with regard to 100 weight parts of a (meth)acrylate monomer.

The weight average molecular weight of the acrylic copolymer is preferably 50,000–2,000,000, more preferably 100,000–1,000,000.

Other monomers can be copolymerized in the acrylic copolymer so far as the characteristics of the copolymer can be kept.

Examples of the other monomers, which can be copolymerized, include vinyl acetate, styrene, methyl styrene, vinyl toluene, acrylonitrile, (meth) acrylamide, N-methyl acrylamide and so forth. The polymerization ratio of these monomers is generally 0-30 weight parts, preferably 0–15 weight parts with regard to 100 weight parts of the sum of the (meth) acrylate monomer and monomer having a heat-reactive functional group.

The mixing ratio of the constituents of the adhesive layer 32, the ionizing radiation curable resin and the heat-reactive resin, is preferably 50–200 weight parts of the heat-reactive resin with regard to 100 weight parts of ionizing radiation curable resin. When the heat-reactive resin is not less than 50 weight parts, the adhesive layer is not pressed out during the adhering step and high adhesiveness to the image surface of photo masks can be achieved. Thereby, workability is improved. When the heat-reactive resin is not more than 200 weight parts, sufficient hardness can be brought to the adhesive layer 32 after it is exposed to ionizing radiation, and mar resistance and resistance to solvents of the protective layer 3 are also improved.

In the present invention, the heat-reactive resin provides initial bond strength of the adhesive layer 32 to the image surface of photo masks, and adhesiveness of the transferred protective film 3. The ionizing radiation curable resins provides adhesiveness to the image surface of photo masks and hardness of the transferred protective film 3 and, as a result, improves mar resistance and resistance to solvents of the protective film 3.

The thickness of the protective film 3 is preferably 1–20 μm. Sufficient mar resistance and resistance to solvents can be achieved with a thickness of not less than 1 μm. When the thickness is not more than 20 μm, developing process of photo masks having a fine resolution pattern can be carried out without problems. The thickness of each of the protective layer 31 and adhesive layer 32 is preferably 0.5–15 μm and may be suitably selected so far as the thickness of the protective film 3 does not exceed its upper limit. When the thickness of the adhesive layer is not less than 0.5 μm, sufficient adhesiveness to the image surface of the photo masks and mar resistance can be obtained. When the thickness is not more than 15 μm, the protective film can be made thin to be applied for a high resolution pattern.

The separator 4 is provided so that the workability is not lowered by adhesiveness of the adhesive layer 32. As a material of the separator 4, a plastic film such as a polyester film, a polyethylene film, a polypropylene film and so forth, paper processed with a release agent such as a silicone release agent can be used.

The protective film transfer sheet 1 for photo masks can be manufactured, for example, as follows: a protective layer 31 and an adhesive layer 32 are formed successively on a support 2 provided with a release layer 22 on a polyethylene terephthalate film 21 which transmits ionizing radiation, and a separator 4 is laminated to the adhesive layer 32.

A method of transferring a protective film will be explained in detail hereinafter.

The method for transferring a protective film of the present invention, which uses the above-mentioned protective film transfer sheet for photo masks for transferring a protective film on photo masks, comprises the steps of:
(1) adhering the adhesive layer of the protective film transfer sheet for photo masks on the image surface of a photo mask,
(2) imparting heat to the adhesive layer,
(3) exposing the adhesive layer to ionizing radiation, and
(4) peeling off the support from the protective film.

In order to transfer a protective film having excellent adhesiveness to the image surface of photo masks, mar resistance and resistance to solvents, which are features of the present invention, the step (1) should be performed at first. In order to improve workability of transfer, it is preferable to carry out the steps (1) and (2) simultaneously.

If the performance of the transferred protective film is considered to be most important, however, the step (2) is not necessarily performed simultaneously with the step (1). It may be performed in any order with regard to steps (3) and (4) but is preferably performed prior to the steps (3) and (4) in order to increase adhesiveness to the image surface of photo masks.

The steps (3) and (4) are performed in an arbitrary order but the step (3) is preferably performed prior to the step (4) in order to protect the protective layer by the support till the adhesive layer becomes sufficiently hard.

In the step (1), the adhesive layer of the protective film transfer sheet for photo masks may be laminated to the image surface of a photo mask in the following manner: the separator, which is provided as occasion demands, is peeled off, and, then, the protective film transfer sheet may be laminated to the image surface of photo masks using a laminator so that the adhesive layer is in contact with the image surface.

In the step (2) of heating the adhesive layer, heat may be imparted (conducted) through the support or photo mask using a heat roll as a laminate roll of step (1) so that the step (2) is performed simultaneously with the step (1). Alternately, after the adhesive layer is laminated using a laminate roll without imparting heat, heat is imparted to the layer by means of a heat roll, by placing in a hot environment such as an oven with internal air circulation, or by exposure to far infrared rays. Although the temperature of the heat roll is not particularly limited because the quantity of heat imparted to the adhesive layer varies depending on the nip pressure of the roll and the conveying speed, it may be suitably selected from the range of 40–150° C., preferably 60–120° C. in term of surface temperature.

By heating the adhesive layer in such a manner after the transfer sheet is laminated, its adhesiveness to the image surface of photo masks is increased.

In the step (3) of exposing the adhesive layer to ionizing radiation (UV or electron beam), UV can be applied using an ultra-high-pressure mercury-vapor lamp, high-pressure mercury-vapor lamp, low-pressure mercury-vapor lamp, carbon arc, metal halide lamp or the like. Electron beam can be applied using various kinds of electron accelerators such as a Cockcroft-Walton type, Van de Graff type, transformer type, isolated core transformer type, Dynamitron type, high-frequency type and so forth.

By increasing the hardness of the adhesive layer by exposure to ionizing radiation in such a way, mar resistance and resistance to solvents of the protective film can be improved.

In the step (4), the support is peeled off from the protective film 3 to accomplish transfer of protective film 3 to the image surface of the photo mask.

EXAMPLES

Examples of the present invention will be now described, which should not be construed as limiting the present invention. In the examples, "part" and "%" are based on weight unless otherwise defined.

1. Synthesis of a Heat-reactive Resin 3.0 g of N-Methylol acrylamide monomer, 84.0 g of n-butyl acrylate monomer, 5.0 g of 2-hydroxyethyl methacrylate monomer, 3.0 g of acrylic acid monomer, 5.0 g of ethyl acrylate monomer, 36.0 g of ethyl acetate, 12.0 g of toluene, 12.0 g of isopropyl alcohol and 0.10 g of $\alpha,\alpha'$-azobis(isobutyronitril) were added to a reactor having a stirrer, a condenser, a thermometer, and a duct for introducing nitrogen, and stirred and heated at 75° C. while introducing nitrogen. The reaction solution was maintained at 75° C. for 8 hours while stirring to complete the reaction and synthesized an acrylic copolymer, which is a heat-reactive resin. 45.0 g of ethyl acetate and 45.0 g of isopropyl alcohol were added to the reaction solution to prepare a heat-reactive resin solution (A) containing 40.0% of nonvolatile content.

2. Preparation of a Protective Film Transfer Sheet for Photo Masks

Example 1

A coating solution for a release layer having the following composition was applied to one side of a polyethylene terephthalate film 21 having a thickness of 50 μm (T-600E: Mitsubishi Chemical Polyester Film Co., Ltd.), and dried to obtain a support 2 provided with a release layer 22 having a thickness of about 1 μm.

| <Coating solution for release layer> | |
|---|---|
| Polyvinyl methyleter/maleic acid copolymer anhydride (GANTREZ AN119:ISP Co., Ltd.) | 50 parts |
| Distilled water | 414 parts |
| Meta-modified alcohol | 36 parts |

Then, a coating solution for protective layer and a coating solution for an adhesive layer (a) having the following compositions were applied successively on the release layer 22 of the support 2 and dried to form a protective layer having a thickness of about 2 μm and an adhesive layer having a thickness of about 2 μm. After the protective layer 31 was dried, it was cured by exposure to UV using a high-pressure mercury lamp. The release surface of a separator 4 (E7006: Toyobo Co., Ltd.) having a thickness of 38 μm was laminated to the adhesive layer 32 to obtain a protective film transfer sheet for photo masks having the structure shown in FIG. 1.

| <Coating solution for protective layer> | |
|---|---|
| Urethane acrylate (UniDic V4005, solid content 64%: Dainippon Ink & Chemicals Inc.) | 125 parts |
| Photopolymerization initiator (IrgaCure 184: Ciba Specialty Chemicals K.K.) | 2.4 parts |
| Toluene | 275 parts |

| <Coating solution for adhesive layer (a)> | |
|---|---|
| 1,6-Bis (3-acryloxy-2-hidroxypropyl)-hexyl ether | 16 parts |
| Photopolymerization initiator (IrgaCure 907: Ciba Specialty Chemicals K.K.) | 1.2 parts |
| Heat-reactive resin solution (A) | 80 parts |
| Ethyl acetate | 232 parts |
| Toluene | 232 parts |

The separator 4 was peeled off from the thus obtained protective film transfer sheet 1 for photo masks and the adhesive layer 32 was laminated to the image surface of a photo mask having a circuit wiring pattern formed on a silver salt film (AGX-7: Kodak Co., Ltd.) using a laminator equipped with a heat roll heated at 100° C. Then, the adhesive layer was cured by exposure to 600 mj/cm$^2$ of UV using a high-pressure mercury lamp and the support 2 was peeled from the protective film to transfer the protective film 3 to the image surface of the photo mask.

Example 2

A protective film transfer sheet 1 for photo masks was obtained in the same manner as in Example 1 except that a coating solution (b) for adhesive layer was used instead of the coating solution (a) for adhesive layer. The protective film of this transfer sheet was transferred to the image surface of a photo mask in the same manner as in Example 1.

| <Coating solution for adhesive layer (b)> | |
|---|---|
| Hydropivalic acid neopentyl glycol diacrylate | 16 parts |
| Photopolymerization initiator (IrgaCure 907: Ciba Specialty Chemicals K.K.) | 1.2 parts |
| Heat-reactive resin solution (A) | 80 parts |
| Ethyl acetate | 232 parts |
| Toluene | 232 parts |

Comparative Example 1

A protective film transfer sheet for photo masks was obtained in the same manner as in Example 1 except that a coating solution for tacky layer was used instead of the coating solution (a) for adhesive layer.

| <Coating solution for tacky layer> | |
|---|---|
| Self-adhesive acrylic resin (SK dyne1102, solid content 40%: Soken Chemical and Engineering Co., Ltd.) | 30 parts |
| Isopropyl alcohol | 75 parts |

The separator was peeled off from the thus obtained protective film transfer sheet for photo masks and the tacky layer was laminated to the image surface of a photo mask having a circuit wiring pattern formed on a silver salt film (AGX-7: Kodak Co., Ltd.) using a laminator. Then, the support was peeled from the protective film to transfer the protective layer and the tacky layer to the image surface of the photo mask.

Comparative Example 2

A protective film transfer sheet for photo masks was obtained in the same manner as in Example 1 except that a coating solution (c) for adhesive layer was used instead of the coating solution (a) for adhesive layer.

| <Coating solution for adhesive layer (c)> | |
|---|---|
| Urethane acrylate (UniDic V4005, solid content 64%: Dainippon Ink & Chemicals Inc.) | 20 parts |
| Dipentaerythritol hexaacrylate (Kayarad PDHA: Nippon Kayaku Co., Ltd.) | 8 parts |
| Photopolymerization initiator (IrgaCure 651: Ciba Specialty Chemicals K.K.) | 1 parts |
| Methylethyl ketone | 35 parts |
| Toluene | 35 parts |

The separator was peeled off from the thus obtained protective film transfer sheet for photo masks and the adhesive layer was laminated to the image surface of a photo mask having a circuit wiring pattern formed on a silver salt film (AGX-7: Kodak Co., Ltd.) using a laminator. Then, the adhesive layer was cured by exposure to 600 mj/cm$^2$ of UV using a high-pressure mercury lamp and the support was peeled from the protective film to transfer the protective layer and the adhesive layer to the image surface of the photo mask.

For the protective film transfer sheets for photo masks obtained in Examples 1, 2 and Comparative examples 1, 2, mar resistance, pencil hardness, adhesiveness, and resistance to solvents of the protective film transferred to the image surface of the photo mask were evaluated. The results are shown in Table 1.

TABLE 1

| | Mar resistance (Load) | | Pencil hardness | Adhesiveness | Resistance to solvents |
|---|---|---|---|---|---|
| | 150 g | 300 g | | | |
| Example 1 | ⊚ | ⊚ | H | 100/100 | ○ |
| Example 2 | ○ | ○ | H | 95/100 | ○ |
| Comparative example 1 | X | X | 2 B | 80/100 | X |
| Comparative example 2 | ○ | Δ | H B | 0/100 | X |

[Mar Resistance (resistance to marring)]

The surface of the protective layer 31 was rubbed back and forth ten times with steel wool #0000 under the load of 150 g or 300 g, and marring in the surface was evaluated visually. Criteria of the visual evaluation is as follows:

⊚: No marring was produced.

○: very slight marring was produced.

Δ: Marring was produced.

X: Marring was produced throughout the surface.

[Pencil Hardness]

Pencil hardness was evaluated based on the pencil hardness test according to JIS-K5400. Specifically, the transferred protective film was scratched by a pair of pencils who have successive density codes. A pair in which one pencil tore the film twice or more and the other pencil tore the film less than twice was found, and the density code of the pencil that tore the film less than twice was defined to be the pencil hardness of the film.

[Adhesiveness]

Adhesiveness was evaluated a crosscut adhesion tape method according to JIS-K5400. Specifically, the film was crosscut to make a hundred of lattices with an interval of 1 mm. A cellophane tape defined by JIS-Z1522 was adhered to the film and then peeled from the film. After the tape was peeled, the state of the film was observed and a number of lattices which were not peeled off was recorded.

[Resistance to Solvents]

The film was rubbed back and forth 20 times with waste imbued with methylethyl ketone. After rubbing, the state of the film was observed and evaluated using the following criteria.

O: No change was observed in the film.

X: The film came away from the image surface.

As shown in Table 1, the protective film transfer sheets 1 for photo masks of Examples 1 and 2 showed excellent results in all of the evaluations of the protective film 3 transferred to the image surface of a photo mask, i.e., mar resistance, pencil hardness, adhesiveness, resistance to solvents.

In particular, the protective film 3 formed using the protective film transfer sheet 1 for photo masks of Example 1 exhibited excellent performance because the adhesive layer 32 was formed by combining an ionizing radiation curable paint consisting of photopolymerizable monomer having a hydroxy group with a heat-reactive resin consisting of an acrylic copolymer containing N-methylol acrylamide monomer, that is a monomer having a hydroxy group, as a monomer having a heat-reactive functional group, and could react with a hydroxy group existing in the image surface of a photo mask to increase the adhesiveness to the image surface of the photo mask and to increase the hardness of the adhesive layer 32.

On the other hand, when the protective film transfer sheet for photo masks of Comparative example 1 was used, the protective layer formed on the tacky layer showed low mar resistance and pencil hardness since the transfer sheet employed a tacky layer instead of the adhesive layer of the present invention. The protective film transfer sheet for photo masks of Comparative example 2 showed no adhesiveness to the image surface of a photo mask, since it employed an adhesive layer composed of only an ionizing radiation curable resin including no heat-reactive resin.

What is claimed is:

1. A protective film transfer sheet comprising a peelable support and a protective film formed on one surface of the peelable support, wherein the protective film comprises a protective layer having a first surface in contact with said peelable support and an adhesive layer formed on and in contact with a second surface of said protective layer, opposite said first surface, and wherein the adhesive layer contains an ionizing radiation curable resin and a heat-reactive resin different from said ionizing radiation curable resin and has pressure-sensitive adhesiveness, the pressure-sensitive adhesiveness of the adhesive layer being increased by heat imparted after transfer onto the image surface of a photo mask, said adhesive layer being curable by exposure to ionizing radiation, and wherein said heat-reactive resin is an acrylic copolymer of an acrylate or methacrylate monomer, as a first monomer, and a second monomer different from said first monomer and having a hydroxyl group, said heat-reactive resin being formed by radical polymerization and having a weight average molecular weight of 50,000–2,000,000.

2. The protective film transfer sheet of claim 1, wherein the heat-reactive resin is included in the adhesive layer in an amount of 50–200 parts based on 100 parts by weight of the ionizing radiation curable resin.

3. The protective film transfer sheet of claim 1, wherein the second monomer is an N-methylol acrylamide monomer.

4. The protective film transfer sheet of claim 1, wherein the ionizing radiation curable resin consists of a paint obtained by mixing one or more kinds of photopolymerizable prepolymers or photopolymerizable monomers which can be crosslinked and cured by exposure to ionizing radiation, and at least one kind of the photopolymerizable prepolymers or photopolymerizable monomers has a hydroxy group.

5. The protective film transfer sheet of claim 1, wherein the thickness of the protective film is in the range of 1–20 µm.

6. The protective film transfer sheet of claim 5, wherein the thickness of the protective layer and adhesive layer is in the range 0.5–15 µm respectively.

7. The protective film transfer sheet of claim 1 wherein said acrylic copolymer has a weight average molecular weight of 100,000–1,000,000.

8. The protective film transfer sheet of claim 1 wherein said acrylic copolymer has a ratio of 1–25 parts by weight of said second monomer to 100 parts by weight of said first monomer.

9. The protective film transfer sheet of claim 1 wherein said acrylic copolymer contains 5–15 weight parts of said second monomer to 100 parts by weight of said first monomer.

* * * * *

UNITED STATES PATENT AND TRADEMARK OFFICE
CERTIFICATE OF CORRECTION

PATENT NO. : 7,087,297 B2 Page 1 of 8
APPLICATION NO. : 09/863324
DATED : August 8, 2006
INVENTOR(S) : Maruyama et al.

It is certified that error appears in the above-identified patent and that said Letters Patent is hereby corrected as shown below:

Please delete title page, delete columns 1 line 1 through columns 12 line 52
Insert title page, and columns 1 line 1 through columns 12 line 50 as shown on the attached pages.

Signed and Sealed this

Thirteenth Day of May, 2008

JON W. DUDAS
*Director of the United States Patent and Trademark Office*

United States Patent
Maruyama et al.

(10) Patent No.: US 7,087,297 B2
(45) Date of Patent: Aug. 8, 2006

(54) PROTECTIVE FILM TRANSFER SHEET FOR PHOTO MASKS AND A METHOD FOR TRANSFERRING A PROTECTIVE FILM USING THE SAME

(75) Inventors: Mitsunori Maruyama, Saitama (JP); Susumu Kurishima, Saitama (JP)

(73) Assignee: Kimoto Co., Ltd., Tokyo (JP)

( * ) Notice: Subject to any disclaimer, the term of this patent is extended or adjusted under 35 U.S.C. 154(b) by 0 days.

(21) Appl. No.: 09/863,324

(22) Filed: May 24, 2001

(65) Prior Publication Data
US 2002/0000287 A1    Jan. 3, 2002

(30) Foreign Application Priority Data
May 25, 2000    (JP)    ............... 2000-154453

(51) Int. Cl.
B32B 7/12    (2006.01)
B32B 15/04    (2006.01)

(52) U.S. Cl. .................. 428/343; 428/354; 428/352; 428/355 AC

(58) Field of Classification Search ........ 428/343, 428/354, 355 R, 355 AC, 355 CN, 352
See application file for complete search history.

(56) References Cited

U.S. PATENT DOCUMENTS
5,051,295 A * 9/1991 Mori et al. ............. 428/195

FOREIGN PATENT DOCUMENTS
JP    63-132097    6/1988
JP    6-20601    6/1994

OTHER PUBLICATIONS
Definition of "Prepolymer", Concise Encyclopedia of Polymer Science and Engineering; J. Kroschwitz; John Wiley & Sons; 1990; p. 902.*
Translation of JP 63-132097 by FLS, Inc., see IDS dated Feb. 3, 2004 for date and additional information.*

* cited by examiner

Primary Examiner—Victor S. Chang
(74) Attorney, Agent, or Firm—Bacon & Thomas, PLLC

(57) ABSTRACT

A protective film transfer sheet includes a peelable support and a protective film formed on the support, wherein the protective film includes a protective layer and an adhesive layer formed on the support in this order and the adhesive layer has pressure-sensitive adhesiveness, the adhesiveness of the adhesive layer being increased upon heating after transferred onto the image surface of a photomask, and is curable by exposure to ionizing radiation. The protective film formed by the protective film transfer sheet is excellent in adhesiveness to the image surface of the photomask, in mar resistance and in resistance to solvents.

9 Claims, 1 Drawing Sheet

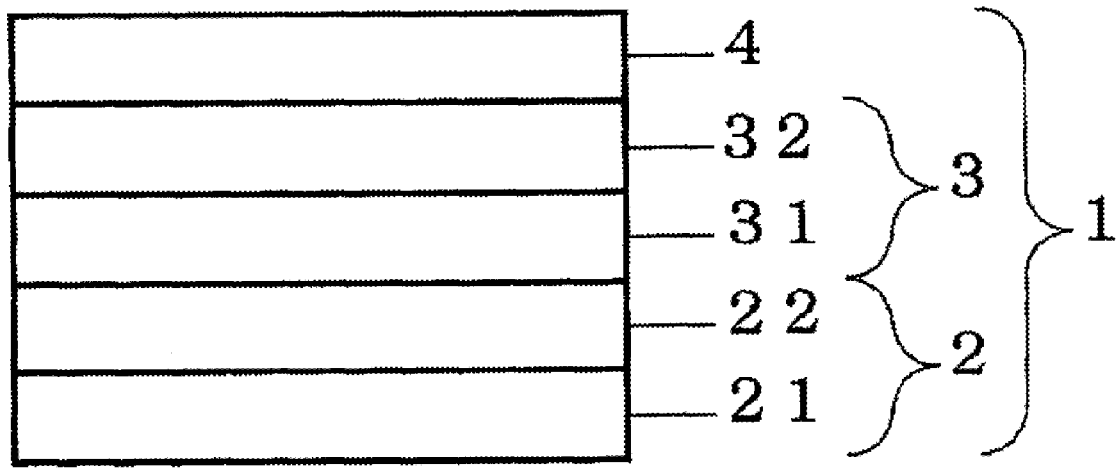

PROTECTIVE FILM TRANSFER SHEET FOR PHOTO MASKS AND A METHOD FOR TRANSFERRING A PROTECTIVE FILM USING THE SAME

CROSS-REFERENCE TO RELATED APPLICATION

This application claims, under 35 USC 119, priority of Japanese Application No. 2000-154453 filed May 25, 2000.

BACKGROUND OF THE INVENTION

The present invention relates to a protective film transfer sheet for photomasks. In particular, it relates to a transfer sheet for transferring a protective film suitable for protecting copies for photomechanical processing or copies of printed wiring boards, which are susceptible to damage, and to a method for transferring a protective film using the transfer sheet.

A surface protective film comprising a thin plastic film such as a polyethylene terephthlate film, as a support, and a releasing film laminated on the plastic film via a self-adhesive or bonding agent has been used for protecting copies of photomechanical process or printed wiring boards, which are susceptible to damage. When the surface protective film is used for photomasks, the releasing film is peeled off from the support and the surface is coated with a self-adhesive or bonding agent and laminated onto the image surface of a photomask.

In recent years, patterns formed on photomasks, which are copies used for photomechanical processing and in manufacture of printed wiring boards, have become complicated and are required to have a high resolving power. This has raised demand for thinner protective films. However, if the surface protective film having the aforementioned structure is made too thin, its workability in laminating onto photomasks become poor, and wrinkles and cells are likely to be produced.

In order to improve such protective films, Japanese Utility Model Publication No. 6-20601, for example, discloses a multiple layer sheet for use in transfer of a protective film which comprises a plastic film having an uneven surface, an abrasion resistance film formed on the uneven surface, an easy-release sheet having a self-adhesive layer and a releasing layer formed on the abrasion resistance film. Another transfer sheet comprising a releasing sheet, a resin layer cured by exposure to UV or electron beam and an adhesive layer consisting an ionizing radiation curable resin formed on the releasing surface of the releasing sheet in this order is also known (Japanese Patent Unexamined Publication No. 63-132097).

However, when the generally used self-adhesive is employed as in the disclosure of Japanese Utility Model Publication No. 6-20601, the transferred protective layer is insufficiently resistant to marring, even if it has a sufficient hardness, because of softness of the self-adhesive layer. In addition, if it is used for protection of photomasks for printed wiring boards, another problem is encountered. That is, photo-resist may stick to the surface of the protective layer and require removal by using organic solvents. However, the protective film has low resistance to solvents and, therefore, has low durability.

The adhesive layer consisting of an ionizing radiation curable resin as disclosed in Japanese Patent Unexamined Publication No. 63-132097 is likely to lose adhesiveness when the thickness is too small. If the protective film with extremely low adhesiveness is used for protection of a photomask in manufacture of a printed wiring board, the adhesive layer separates from the image surface of the photo mask when the photo mask is peeled from the photo-resist on the board. Thus, the protective layer has low durability. Further, if the adhesive layer consists of an ionizing radiation curable resin alone, fluidity of the adhesive layer becomes too high, and workability becomes poor because the adhesive layer is likely to be pressed out upon laminating.

SUMMARY OF THE INVENTION

The present invention aims at solving the above-mentioned problems. An object of the present invention is to provide a protective film transfer sheet for photomasks capable of providing a protective film, which is excellent in adhesiveness to the image surface of photomasks, in mar resistance and in resistance to solvents when transferred to photomasks. Another object of the present invention is to provide a method for transferring a protective film using the transfer sheet, which is capable of providing a protective film excellent in adhesiveness to the image surface of photo masks, mar resistance and resistance to solvents when transferred to photo masks.

Accordingly, the present invention provides a protective film transfer sheet which comprises a peelable support and a protective film formed on the support, wherein the protective film comprises a protective layer and an adhesive layer formed on the support in this order and the adhesive layer has pressure-sensitive adhesiveness, the adhesiveness of the adhesive layer being increased by heat imparted after it is transferred onto the image surface of a photomask, and is curable by exposure to ionizing radiation.

In the protective film transfer sheet of the present invention, the adhesive layer contains at least an ionizing radiation curable resin and a heat-reactive resin.

In the protective film transfer sheet of the present invention, the heat-reactive resin is preferably an acrylic copolymer containing a monomer having a heat-reactive functional group(s).

In the protective film transfer sheet of the present invention, the heat-reactive functional group(s) is preferably hydroxyl group.

In the protective film transfer sheet of the present invention, the preferred monomer having a hydroxyl group is N-methylol acrylamide monomer.

In a preferred embodiment of the protective film transfer sheet for photomasks of the present invention, the ionizing radiation curable resin consists of a paint containing one or more kinds of photopolymerizable prepolymers or photopolymerizable monomers which can be crosslinked and cured by exposure to ionizing radiation, and at least one of a photopolymerizable prepolymer or photopolymerizable monomer having a hydroxyl group.

A method for transferring a protective film in accordance with the present invention, which uses the above-described protective film transfer sheet for transferring a protective film onto the image surface of a photomask, comprises the steps of:

(1) adhering the adhesive layer of the protective film transfer sheet onto the image surface of a photomask,
(2) heating the adhesive layer,
(3) exposing the adhesive layer to ionizing radiation, and
(4) peeling off the support from the protective film.

In the method for transferring a protective film of the present invention, the steps (1) and (2) are preferably performed simultaneously and thereafter the steps (3) and (4) are performed in this order.

According to the present invention, there is provided a protective film transfer sheet capable of providing a protective film which is excellent in adhesiveness to the image surface of photomasks, in mar resistance and in resistance to solvents when transferred onto photomasks.

BRIEF DESCRIPTION OF THE DRAWING

FIG. 1 is a sectional view of an example of a protective film transfer sheet of the present invention.

PREFERRED EMBODIMENTS OF THE INVENTION

The protective film transfer sheet of the present invention is described in further detail with reference to the attached drawing.

As shown in FIG. 1, the protective film transfer sheet 1 of the present invention includes protective film 3 consisting of a protective layer 31 and an adhesive layer 32 on a peelable support 2 and, as occasion demands, a separator 4 is laminated to adhesive layer 32.

The support 2 of the present invention is a base material on which the protective layer 31 and adhesive layer 32 are laminated successively and facilitates transfer of a thin protective film 3 onto the image surface of a photomask.

Although the support 2 is not particularly limited, it is preferably transparent to ionizing radiation so that the adhesive layer 32 can be exposed to ionizing radiation through the support 2 and cured. A transparent plastic film such as a polyethylene terephthalate film, polycarbonate film, polypropylene film, polyethylene film, polyvinyl chloride film, polyethylene naphthalate film, and polystyrene film may be used for the support 2. A biaxially stretched film is preferable for its excellent mechanical strength, heat resistance and dimensional stability. The thickness of the support 2 is preferably 5–125 μm in the light of handling.

In order to improve release of the support 2 from the protective layer 31, a plastic film 21 having a release layer 22 may be used for the support 2.

The release layer 22 remains on the surface of the plastic film 21 after transferring the protective film 3 and allows the support 2 removed easily. Material of the release layer may be selected from melamine resins, silicone resins, amino alkyd resins, urethane resins, urea resins, epoxy resins, fluorine resins, polyvinyl alcohol resins, polyvinyl methylether/maleic acid anhydrate copolymers, and so forth taking into account combination with the protective layer 31. Among them, water-soluble resins such as polyvinyl alcohol resins, polyvinyl methylether/maleic acid anhydrate copolymers and the like are preferable from the viewpoint of ease of release and ease of laminating.

When the transferred surface is required to be uneven, the release layer 22 may include matting agents. In order to improve adhesiveness to the plastic film 21, an easy adhesive layer may be provided between the release layer 22 and the plastic film 21.

The protective layer 31 is required to have high mar resistance and resistance to solvents, because the protective layer 31 becomes an uppermost layer of the protective film after it is transferred to the image surface of a photomask and, therefore, its properties directly affect those of the protective film 3.

The protective layer 31 having such high mar resistance and resistance to solvents can be obtained by applying a composition consisting of a thermosetting resin or an ionizing radiation curable resin on the support 2 using a known coating technique and curing it.

Usable thermosetting resins include resins crosslinkable by heat such as silicone resins, melamine resins, epoxy resins, amino alkyd resins, urethane resins, acrylic resins, polyester resins, phenol resins. These resins may be used alone but are preferably mixed with a hardening agent in order to improve crosslinking and hardness of the crosslinked film.

The ionizing radiation curable resin is composed of a paint crosslinkable and curable at least by exposure to ionizing radiation (ultraviolet ray or electron beam). As the ionizing radiation curable paint, a mixture of one or more kinds of photopolymerizable prepolymers or photopolymerizable monomers may be used.

Usable photopolymerizable prepolymers include various kinds of (meth)acrylates such as polyester(meth)acrylate, epoxy(meth)acrylate, urethane(meth)acrylate, polyether (meth)acrylate, polyol(meth)acrylate, melamine(meth)acrylate.

Examples of the photopolymerizable monomer include styrene monomers such as styrene, α-methyl styrene, (meth)acrylate esters such as methyl(meth)acrylate, 2-ethylhexyl (meth)acrylate, methoxyethyl(meth)acrylate, butoxyethyl (meth)acrylate, butyl(meth)acrylate, methoxybutyl(meth) acrylate, phenyl(meth)acrylate, ethyl(meth)acrylate, propyl (meth)acrylate, ethoxymethyl(meth)acrylate, lauryl(meth) acrylate, unsaturated carboxylic acid amides such as (meth) acryl amide, substituted amino alcohol esters of unsaturated acid such as 2-(N,N-diethylamino)ethyl(meth)acrylate, 2-(N,N-dibenzylamino)ethyl (meth)acrylate, 2-(N,N-diethylamino)propyl (meth)acrylate, multifunctional compounds such as ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di (meth) acrylate, tetrapropylene glycol di(meth)acrylate, nonapropylene glycol di (meth)acrylate, polypropylene glycol di(meth)acrylate, pentaerythritol tri (meth)acrylate, dipentaerythritol tri(meth)acrylate, pentaerythritol hexa(meth)acrylate, trimethylolpropane(meth) acrylate, glycerol tri(meth)acrylate, tris-(2-hydroxyethyl)-isocyanuric acid ester (meth)acrylate, 2,2-bis[4-(acryloxy diethoxy)phenyl]propane, 3-phenoxy-2-propanoyl acrylate, 1,6-bis (3-acryloxy-2-hydroxypropyl)-hexyl ether, and polythiol compounds having two or more of thiol groups per molecule such as trimethylol propane trithioglycolate, trimethylol propane trithiopropylate, pentaerythritol tetrathioglycolate.

Various additives can be added to the ionizing radiation curable paint. When UV is used for curing, it is preferable to add a photopolymerization initiator, UV intensifier or the like. Usable photopolymerization initiators include acetophenones, benzophenones, Michler's ketone, benzoin, benzylmethylketal, benzoyl benzoate, α-acyloxy ester, thioxanthenes and the like. As the UV intensifier, n-butylamine, triethylamine, tri-n-butylphosphine and the like can be used.

Examples of conventional coating methods for applying the aforementioned thermosetting resin or ionizing radiation curable resin to the support include knife coating, doctor coating, bar coating, roll coating, blade coating, kiss-roll coating, spray coating, spin coating, dip coating and the like.

The adhesive layer 32 of the present invention is adhered to the image surface of a photomask by its pressure-sensitive adhesiveness at a normal temperature. The adhesiveness to the image surface of a photomask increases by heating after the layer 32 is adhered. In addition, when the adhesive layer 32 is cured by exposure to ionizing radiation, the adhesiveness and the hardness of the layer 32 also increase.

Such an adhesive layer 32 contains an ionizing radiation curable resin and a heat-reactive resin.

The aforementioned paint for the protective layer 31, which is crosslinkable and curable by exposure to ionizing radiation (ultraviolet ray or electron beam), can be used for the ionizing radiation curable resin for the adhesive layer 32. Photopolymerizable prepolymers or photopolymerizable monomers used for the ionizing radiation curable paint are preferably those having a hydroxy group(s).

When the adhesive layer 32 is formed using a mixture of an ionizing radiation curable paint containing the photopolymerizable prepolymers or photopolymerizable monomers having a hydroxy group(s) and a heat-reactive resin consisting of an acrylic copolymer containing a monomer having a hydroxy group such as an N-methylol acrylamide monomer, the hardness of the adhesive layer 32 can be improved by reaction of ionizing radiation curable resins with the heat-reactive resins and the adhesiveness to the image surface of the photomask is also increased.

Examples of the the photopolymerizable prepolymers or photopolymerizable monomers having a hydroxy group(s) include pentaerythritol tri(meth)acrylate, 1,6-bis(3-acryloxy-2-hydroxypropyl)-hexylether.

Similarly to the aforementioned paint for the protective layer 31, the ionizing radiation curable paint may contain photopolymerization initiators, UV intensifier and the like.

Reaction of the heat-reactive resin proceeds with heating after the adhesive layer 32 is adhered to the photomask, at the interfaces between the adhesive layer 32 and protective layer 31 and between the adhesive layer 32 and the image surface of photomask, so that the adhesiveness at the interfaces is increased. Generally, the heat reaction of heat-reactive resins also increases the hardness of the adhesive layer 32.

The heat-reactive resin consists of an acrylic copolymer having a heat-reactive functional group as a monomer component. Such an acrylic copolymer can be a copolymer of (meth)acrylate monomer and a monomer having a heat-reactive functional group.

Examples of the (meth)acrylate monomer include ethyl (meth)acrylate, butyl(meth)acrylate, amyl(meth)acrylate, 2-ethylhexyl(meth)acrylate, octyl(meth)acrylate, cyclohexyl (meth)acrylate, benzyl(meth)acrylate and the like. One or more of these monomers can be used in a mixture.

Examples of monomers having a heat-reactive functional group include monomers having a carboxy group such as (meth)acrylic acid, crotonic acid, maleic acid, fumaric acid, itaconic acid, monomers having a hydroxy group such as 2-hydroxyethyl(meth)acrylate, 2-hydroxypropyl(meth)acrylate, 4-hydroxybutyl(meth)acrylate, N-methylol acrylamide, aryl alcohol, monomers having a tertiary amino group such as dimetyl aminoethyl(meth)acrylate, dietyl aminoethyl (meth)acrylate, dimetyl aminopropyl(meth)acrylate, monomers having an amide group such as (meth)acrylamide, a monomer having a N-substituted amide group such as N-methyl(meth)acrylamide, N-ethyl(meth)acrylamide, N-methoxymethyl(meth)acrylamide, N-ethoxymethyl (meth) acrylamide, N-t-butyl acrylamide, N-octyl acrylamide, monomers having an epoxy group such as glycidyl (meth) acrylate. Among them, monomers having a hydroxy group such as an N-methylol acrylamide are particularly preferred for obtaining excellent adhesiveness to the object on which the adhesive layer 32 of the present invention is transferred, i.e., the image surface of a photomask. It is considered that, when a monomer having a hydroxy group is used for the adhesive layer 32, the monomer reacts with hydroxy groups in the image surface of the photomask to increase the adhesiveness. This strong adhesion of the protective film 3 and the image surface of a photomask prevents the protective film 3 from separating from the image surface during working and, thereby, workability is improved.

The ratio of the monomers of the acrylic copolymer, i.e., a (meth)acrylate monomer, and monomer having a heat-reactive functional group, is 1–25 weight parts, preferably 5–15 weight parts of the monomer having a heat-reactive functional group per 100 weight parts of a (meth)acrylate monomer.

The weight average molecular weight of the acrylic copolymer is preferably 50,000–2,000,000, more preferably 100,000–1,000,000.

Other monomers can be copolymerized in the acrylic copolymer, provided the characteristics of the copolymer are not compromised.

Examples of such other monomers, which can be copolymerized, include vinyl acetate, styrene, methyl styrene, vinyl toluene, acrylonitrile, (meth)acrylamide, N-methyl acrylamide and so forth. The ratio of these monomers is generally 0–30 weight parts, preferably 0–15 weight parts per 100 weight parts of the sum of the (meth)acrylate monomer and monomer having a heat-reactive functional group.

The mixing ratio of the constituents of the adhesive layer 32, the ionizing radiation curable resin and the heat-reactive resin, is preferably 50–200 weight parts of the heat-reactive resin per 100 weight parts of ionizing radiation curable resin. When the heat-reactive resin is not less than 50 weight parts, the adhesive layer is not pressed out during the transfer and high adhesiveness to the image surface of photomasks can be achieved. Thereby, workability is improved. When the heat-reactive resin is not more than 200 weight parts, sufficient hardness can be imparted to the adhesive layer 32 after it is exposed to ionizing radiation, and mar resistance and resistance to solvents of the protective layer 3 are also improved.

In the present invention, the heat-reactive resin provides initial bond strength of the adhesive layer 32 to the image surface of a photomask, and adhesiveness of the transferred protective film 3. The ionizing radiation curable resins provides adhesiveness to the image surface of the photomask and hardness of the transferred protective film 3 and, as a result, improves mar resistance and resistance to solvents of the protective film 3.

The thickness of the protective film 3 is preferably 1–20 μm. Sufficient mar resistance and resistance to solvents can be achieved with a thickness of not less than 1 μm. When the thickness is not more than 20 μm, a fine resolution pattern can be obtained in developing without problems. The thickness of each of the protective layer 31 and adhesive layer 32 is preferably 0.5–15 μm and may be suitably varied provided the thickness of the protective film 3 does not exceed its upper limit. When the thickness of the adhesive layer is not less than 0.5 μm, sufficient adhesiveness to the image surface of the photomask and mar resistance can be obtained. When the thickness is not more than 15 μm, the protective film is sufficiently thin to provide a high resolution pattern.

The separator 4 is provided so that the workability is not lowered by adhesiveness of the adhesive layer 32. The material of the separator 4 may be a plastic film such as a polyester film, a polyethylene film, a polypropylene film and so forth, or paper coated with a release agent such as a silicone.

The protective film transfer sheet 1 can be manufactured, for example, as follows: a protective layer 31 and an adhesive layer 32 are formed successively on a support 2, consisting of a release layer 22 on a polyethylene terephthalate film 21 which transmits ionizing radiation, and a separator 4 is laminated to the adhesive layer 32.

A method of transferring a protective film will be explained in detail hereinafter.

The method for transferring a protective film of the present invention, which uses the above-mentioned protective film transfer sheet, comprises the steps of:

(1) adhering the adhesive layer of the protective film transfer sheet onto the image surface of a photo mask,
(2) imparting heat to the adhesive layer,
(3) exposing the adhesive layer to ionizing radiation, and
(4) peeling off the support from the protective film.

In order to transfer a protective film having excellent adhesiveness to the image surface of a photomask, mar resistance and resistance to solvents, which are features of the present invention, the step (1) should be performed at first. In order to improve ease of transfer, it is preferable to carry out the steps (1) and (2) simultaneously.

If the performance of the transferred protective film is considered to be most important, however, the step (2) is not necessarily performed simultaneously with the step (1). It may be performed in any order relative to steps (3) and (4) but is preferably performed prior to steps (3) and (4) in order to increase adhesiveness to the image surface of the photomask.

Steps (3) and (4) are performed in an arbitrary order but the step (3) is preferably performed prior to step (4) in order to protect the protective layer with the support until the adhesive layer becomes sufficiently hard.

In step (1), the adhesive layer of the protective film transfer sheet may be laminated to the image surface of a photomask in the following manner: the separator, which is provided as occasion demands, is peeled off, and then the protective film transfer sheet may be laminated to the image surface of a photomask using a laminator so that the adhesive layer in contact with the image surface.

In step (2), heating the adhesive layer, heat may be imparted (conducted) through the support or photomask using a heat roll as the laminater roll used in step (1) so that step (2) is performed simultaneously with the step (1). Alternately, after the adhesive layer is laminated using a laminater roll without imparting heat, heat is imparted to the layer by means of a heat roll, by placing in a hot environment such as an oven with internal air circulation, or by exposure to far infrared rays. Although the temperature of the heat roll is not particularly limited because the quantity of heat imparted to the adhesive layer varies depending on the nip pressure of the roll and the conveying speed, it may be suitably selected from within the range of 40-150° C., preferably 60-120° C. in terms of surface temperature.

By heating the adhesive layer in such a manner after the transfer sheet is laminated, its adhesiveness to the image surface of the photomask is increased.

In step (3) of exposing the adhesive layer to ionizing radiation (UV or electron beam), UV can be applied using an ultra-high-pressure mercury-vapor lamp, high-pressure mercury-vapor lamp, low-pressure mercury-vapor lamp, carbon arc, metal halide lamp or the like. An Electron beam can be applied using an electron accelerator such as a Cockcroft-Walton type, Van de Graff type, transformer type, isolated core transformer type, Dynamitron type, high-frequency type and so forth.

By increasing the hardness of the adhesive layer by exposure to ionizing radiation in such a way, mar resistance and resistance to solvents of the protective film can be improved.

In step (4), the support is peeled off from the protective film 3 to complete transfer of protective film 3 to the image surface of the photomask.

EXAMPLES

Examples of the present invention will be now described, which should not be construed as limiting the present invention. In the examples, "part" and "%" are based on weight unless otherwise, defined.

1. Synthesis of a Heat-Reactive Resin 3.0 g of N-Methylol acrylamide monomer, 84.0 g of n-butyl acrylate monomer, 5.0 g of 2-hydroxyethyl methacrylate monomer, 3.0 g of acrylic acid monomer, 5.0 g of ethyl acrylate monomer, 36.0 g of ethyl acetate, 12.0 g of toluene, 12.0 g of isopropyl alcohol and 0.10 g of α,α'-azobis(isobutyronitrile) were added to a reactor having a stirrer, a condenser, a thermometer, and a duct for introducing nitrogen, and stirred and heated at 75° C. while introducing nitrogen. The reaction solution was maintained at 75° C. for 8 hours while stirring to complete the reaction and to synthesize an acrylic copolymer, which is a heat-reactive resin. 45.0 g of ethyl acetate and 45.0 g of isopropyl alcohol were added to the reaction solution to prepare a heat-reactive resin solution (A) containing 40.0% of nonvolatiles.

2. Preparation of a Protective Film Transfer Sheet for Photomasks

Example 1

A coating solution for a release layer having the following composition was applied to one side of a polyethylene terephthalate film 21 having a thickness of 50 μm (T-600E: Mitsubishi chemical Polyester Film Co., Ltd.), and dried to obtain a support 2 provided with a release layer 22 having a thickness of about 1 μm.

| Coating solution for release layer | |
|---|---|
| Polyvinyl methylether/maleic acid copolymer anhydride (GANTREZ AN119:ISP Co., Ltd.) | 50 parts |
| Distilled water | 414 parts |
| Meta-modified alcohol | 36 parts |

Then, a coating solution for the protective layer and a coating solution for an adhesive layer (a) having the following compositions were applied successively on the release layer 22 of the support 2 and dried to form a protective layer having a thickness of about 2 μm and an adhesive layer having a thickness of about 2 μm. After the protective layer 31 dried, it was cured by exposure to UV using a high-pressure mercury lamp. The release surface of a separator 4 (E7006: Toyobo Co., Ltd.) having a thickness of 38 μm was laminated to the adhesive layer 32 to obtain a protective film transfer sheet having the structure shown in FIG. 1.

| Coating solution for protective layer | |
|---|---|
| Urethane acrylate (UniDic V4005, solids content 64%: Dainippon Ink & Chemicals Inc.) | 125 parts |
| Photopolymerization initiator (Irgacure 184: Ciba Specialty Chemicals K.K.) | 2.4 parts |
| Toluene | 275 parts |

| Coating solution for adhesive layer (a) | |
|---|---|
| 1,6-Bis (3-acryloxy-2-hydroxypropyl)-hexyl ether | 16 parts |
| Photopolymerization initiator (Irgacure 907: Ciba Specialty Chemicals K.K.) | 1.2 parts |
| Heat-reactive resin solution (A) | 80 parts |
| Ethyl acetate | 232 parts |
| Toluene | 232 parts |

The separator 4 was peeled off from the thus obtained protective film transfer sheet 1 and the adhesive layer 32 was laminated to the image surface of a photomask having a circuit wiring pattern formed on a silver salt film (AGX-7: Kodak Co., Ltd.) using a laminator equipped with a heat roll at 100° C. Then, the adhesive layer was cured by exposure to 600 mj/cm² of UV using a high-pressure mercury lamp and the support 2 was peeled from the protective film to transfer the protective film 3 to the image surface of the photomask.

Example 2

A protective film transfer sheet 1 was obtained in the same manner as in Example 1 except that a coating solution (b) was used for the adhesive layer instead of the coating solution (a). The protective film of this transfer sheet was transferred to the image surface of a photomask in the same manner as in Example 1.

| Coating solution for adhesive layer (b) | |
|---|---|
| Hydropivalic acid neopentyl glycol diacrylate | 16 parts |
| Photopolymerization initiator (Irgacure 907: Ciba Specialty Chemicals K.K.) | 1.2 parts |
| Heat-reactive resin solution (A) | 80 parts |
| Ethyl acetate | 232 parts |
| Toluene | 232 parts |

Comparative Example 1

A protective film transfer sheet was obtained in the same manner as in Example 1 except that a coating solution was used for the tacky layer instead of the coating solution (a) for an adhesive layer.

| Coating solution for tacky layer | |
|---|---|
| Self-adhesive acrylic resin (SK dyne1102, solid content 40%: Soken Chemical and Engineering Co., Ltd.) | 30 parts |
| Isopropyl alcohol | 75 parts |

The separator was peeled off from the thus obtained protective film transfer sheet and the tacky layer was laminated to the image surface of a photomask having a circuit wiring pattern formed on a silver salt film (AGX-7: Kodak Co., Ltd.) using a laminator. Then, the support was peeled from the protective film to transfer the protective layer and the tacky layer to the image surface of the photomask.

Comparative Example 2

A protective film transfer sheet was obtained in the same manner as in Example 1 except that a coating solution (c) was used for adhesive layer instead of the coating solution (a).

| Coating solution for adhesive layer (c) | |
|---|---|
| Urethane acrylate (UniDic V4005, solid content 64%: Dainippon Ink & Chemicals Inc.) | 20 parts |
| Dipentaerythritol hexaacrylate (Kayarad PDHA: Nippon Kayaku Co., Ltd.) | 8 parts |
| Photopolymerization initiator (Irgacure 651: Ciba Specialty Chemicals K.K.) | 1 parts |
| Methylethyl ketone | 35 parts |
| Toluene | 35 parts |

The separator was peeled off from the thus obtained protective film transfer sheet and the adhesive layer was laminated to the image surface of a photomask having a circuit wiring pattern formed on a silver salt film (AGX-7: Kodak Co., Ltd.) using a laminator. Then, the adhesive layer was cured by exposure to 600 mj/cm² of UV using a high-pressure mercury lamp and the support was peeled from the protective film to transfer the protective layer and the adhesive layer to the image surface of the photomask.

For the protective film transfer sheets obtained in Examples 1, 2 and Comparative Examples 1, 2, mar resistance, pencil hardness, adhesiveness, and resistance to solvents of the protective film transferred to the image surface of the photo mask were evaluated. The results are shown in Table 1.

TABLE 1

| | Mar resistance (Load) | | Pencil hardness | Adhesiveness | Resistance to solvents |
|---|---|---|---|---|---|
| | 150 g | 300 g | | | |
| Example 1 | ⊚ | ⊚ | H | 100/100 | O |
| Example 2 | O | O | H | 95/100 | O |
| Comparative example 1 | X | X | 2 B | 80/100 | X |
| Comparative example 2 | O | Δ | H B | 0/100 | X |

Mar Resistance (resistance to marring)

The surface of the protective layer 31 was rubbed back and forth ten times with steel wool #0000 under a load of 150 g or 300 g, and marring in the surface was evaluated visually, criteria of the visual evaluation were as follows:

⊚: No marring was produced.

O: very slight marring was produced.

Δ: Marring was produced.

X: Marring was produced throughout the surface.

Pencil Hardness

Pencil hardness was evaluated based on the pencil hardness test according to JIS-K5400. Specifically, the transferred protective film was scratched by a pair of pencils having successive density codes. A pair in which one pencil tore the film twice or more and the other pencil tore the film less than twice was found, and the density code of the pencil that tore the film less than twice was defined to be the pencil hardness of the film.

Adhesiveness

Adhesiveness was evaluated by the crosscut adhesion tape method according to JIS-K5400. Specifically, the film was crosscut to make a hundred of lattices with an interval of 1 mm. A cellophane tape defined by JIS-Z1522 was adhered to the film and then peeled from the film. After the tape was peeled, the state of the film was observed and the number of lattices which were not peeled off was recorded.

Resistance to Solvents

The film was rubbed back and forth 20 times with waste imbued with methylethyl ketone. After rubbing, the state of the film was observed and evaluated using the following criteria.

O: No change was observed in the film.

X: The film came away from the image surface.

As shown in Table 1, the protective film transfer sheets 1 of Examples 1 and 2 showed excellent results in all of the evaluations of the protective film 3 transferred to the image surface of a photomask, i.e., mar resistance, pencil hardness, adhesiveness, and resistance to solvents.

In particular, the protective film 3 formed using the protective film transfer sheet 1 of Example 1 exhibited excellent performance because the adhesive layer 32 was formed by combining an ionizing radiation curable paint consisting of a photopolymerizable monomer having a hydroxy group with a heat-reactive resin consisting of an acrylic copolymer containing N-methylol acrylamide monomer. The monomer having a hydroxy group as a heat-reactive functional group reacts with a hydroxy group existing in the image surface of a photomask to increase the adhesiveness to the image surface of the photomask and to increase the hardness of the adhesive layer 32.

On the other hand, when the protective film transfer sheet of comparative example 1 was used, the protective layer formed on the tacky layer showed low mar resistance and pencil hardness since the transfer sheet employed a tacky layer instead of the adhesive layer of the present invention. The protective film transfer sheet of Comparative example 2 showed no adhesiveness to the image surface of a photomask, since it employed an adhesive layer composed of only an ionizing radiation curable resin, i.e., no heat-reactive resin was present.

What is claimed is:

1. A protective film transfer sheet comprising a peelable support and a protective film formed on one surface of the peelable support, wherein the protective film comprises a protective layer having a first surface in contact with said peelable support and an adhesive layer formed on and in contact with a second surface of said protective layer, opposite said first surface, and wherein the adhesive layer contains an ionizing radiation curable resin and a heat-reactive resin different from said ionizing radiation curable resin and has pressure-sensitive adhesiveness, the pressure-sensitive adhesiveness of the adhesive layer being increased by heat imparted after transfer onto the image surface of a photo mask, said adhesive layer being curable by exposure to ionizing radiation, and wherein said heat-reactive resin is an acrylic copolymer of an acrylate or methacrylate monomer, as a first monomer, and a second monomer different from said first monomer and having a hydroxyl group, said heat-reactive resin being formed by radical polymerization and having a weight average molecular weight of 50,000–2,000,000.

2. The protective film transfer sheet of claim 1, wherein the heat-reactive resin is included in the adhesive layer in an amount of 50–200 parts based on 100 parts by weight of the ionizing radiation curable resin.

3. The protective film transfer sheet of claim 1, wherein the second monomer is an N-methylol acrylamide monomer.

4. The protective film transfer sheet of claim 1, wherein the ionizing radiation curable resin consists of a paint obtained by mixing one or more kinds of photopolymerizable prepolymers or photopolymerizable monomers which can be crosslinked and cured by exposure to ionizing radiation, and at least one kind of the photopolymerizable prepolymers or photopolymerizable monomers has a hydroxy group.

5. The protective film transfer sheet of claim 1, wherein the thickness of the protective film is in the range of 1–20 μm.

6. The protective film transfer sheet of claim 5, wherein the thickness of the protective layer and adhesive layer is in the range 0.5–15 μm respectively.

7. The protective film transfer sheet of claim 1 wherein said acrylic copolymer has a weight average molecular weight of 100,000–1,000,000.

8. The protective film transfer sheet of claim 1 wherein said acrylic copolymer has a ratio of 1–25 parts by weight of said second monomer to 100 parts by weight of said first monomer.

9. The protective film transfer sheet of claim 1 wherein said acrylic copolymer contains 5–15 weight parts of said second monomer to 100 parts by weight of said first monomer.

* * * * *